United States Patent [19]

Ichikawa

[11] Patent Number: 5,220,294
[45] Date of Patent: Jun. 15, 1993

[54] PHASE-LOCKED LOOP CIRCUIT
[75] Inventor: Masaomi Ichikawa, Tokyo, Japan
[73] Assignee: NEC Corporation, Tokyo, Japan
[21] Appl. No.: 703,250
[22] Filed: May 21, 1991
[30] Foreign Application Priority Data
  May 21, 1990 [JP] Japan .................................. 2-131548
[51] Int. Cl.$^5$ ............................................. H03L 7/10
[52] U.S. Cl. ..................... 331/17; 331/1A; 331/16
[58] Field of Search ................ 331/1 A, 10, 14, 16, 331/17, 25, DIG. 2
[56] References Cited
  U.S. PATENT DOCUMENTS
  4,714,899 12/1987 Kurtzman et al. ................. 331/25 X
  4,935,707 6/1990 Irwin ...................................... 331/16
  4,980,653 12/1990 Shepherd ........................... 331/25 X Primary Examiner—David Mis
Attorney, Agent, or Firm—Whitham & Marhoefer

[57] ABSTRACT

A phase-locked loop circuit comprises first and second charge pumps which apply charge and discharge voltages to a control voltage generator. The control voltage generator applies a control voltage which is dependent on the charge and discharge voltages to a voltage controlled oscillator. The voltage controlled oscillator generates an oscillation frequency dependent on the control voltage. The oscillation frequency is compared with a reference frequency to detect a difference therebetween. The first charge pump supplies a charge or discharge voltage to the control voltage generator intermittently for a first period, and the second charge pump, in parallel with the first charge pump, supplies a charge or discharge voltage to the control voltage generator continually for a second period subsequently to the first period, so that a time by which the difference becomes zero is shortened by use of the second charge pump as compared to a case where the first charge pump is only used.

5 Claims, 10 Drawing Sheets

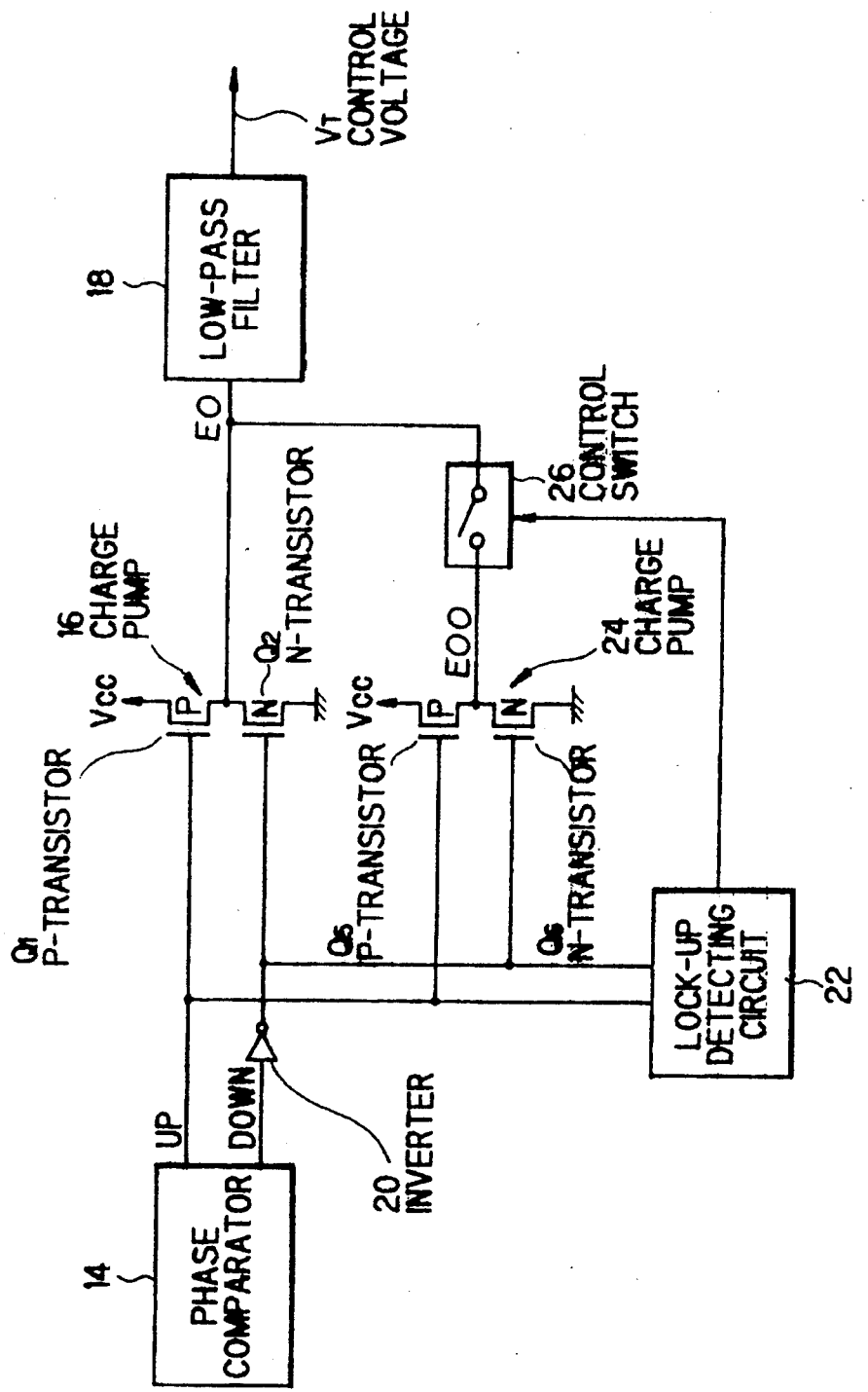

5,220,294

PHASE-LOCKED LOOP CIRCUIT

FIELD OF THE INVENTION

This invention relates to a phase-locked loop circuit, and more particularly to a phase-locked loop circuit comprising a local oscillator of a frequency synthesizer type radio-tuner.

BACKGROUND OF THE INVENTION

A phase-locked loop circuit is used, for instance, for a frequency synthesizer type radio receiver, in which it is required that a tuning speed of an auto-tuning system and an operation speed of an AF (alternative frequency) system in an RDS (radio data system) broadcasting network recently introduced in Europe are increased. For this purpose, a lock-up time is required to be shortened in the phase-locked loop circuit.

One type of a conventional phase-locked loop circuit comprises a voltage controlled oscillator used as a local oscillator in a frequency synthesizer type radio receiver. The voltage controlled oscillator is controlled to provide an oscillation signal having a predetermined frequency by a voltage having a value dependent on a phase relation between the oscillation signal and a reference signal having a reference frequency. The control voltage is of an intermittently generated pulse having a pulse width and a pulse period which are determined by charge and discharge times based on the phase relation. As a result of applying the intermittent pulse to the voltage controlled oscillator, a frequency of an oscillation signal is locked up to be a predetermined value, so that the oscillation signal is mixed as a local oscillation signal with a receiving signal in a radio receiver.

According to the conventional phase-locked loop circuit, however, there is a disadvantage in that the lock-up speed is not fast sufficiently as expected, because the control voltage is intermittently applied to the voltage controlled oscillator. Even if a plurality of circuits for charging and discharging an intermittent pulse generating circuit are provided to increase charge and discharge capability, thereby shortening the lock-up time, there is a limitation in the improvement, as far as the intermittent pulse is used therein.

SUMMARY OF THE INVENTION

Accordingly, it is an object of the invention to provide a phase-locked loop circuit in which the lock-up speed is much increased.

It is a further object of the invention to provide a phase-locked loop circuit in which overshoot and undershoot of a frequency occurring in approaching to a lock-up frequency are suppressed to shorten the lock-up time.

According to the invention, a phase-locked loop circuit comprises:

a first charge pump for driving a low-pass filter in response to an output of a phase comparator;

a second charge pump for driving the low-pass filter;

means for controlling the second charge pump to drive the low-pass filter continuously in accordance with a change of a frequency dividing ratio regardless of the output of the phase comparator; and means for setting the second charge pump in a non-activate state, when the output of the phase comparator is changed or a predetermined time is elapsed.

BRIEF DESCRIPTION OF THE DRAWINGS

The invention will be explained in more detail in conjunction with appended drawings; wherein:

FIG. 3 is a block diagram showing a second conventional phase-locked loop circuit;

DESCRIPTION OF THE PREFERRED EMBODIMENTS

Before describing a phase-locked loop circuit according to the invention, the conventional phase-locked loop circuit briefly described before will be explained in conjunction with FIGS. 1 to 3.

Figure 1:
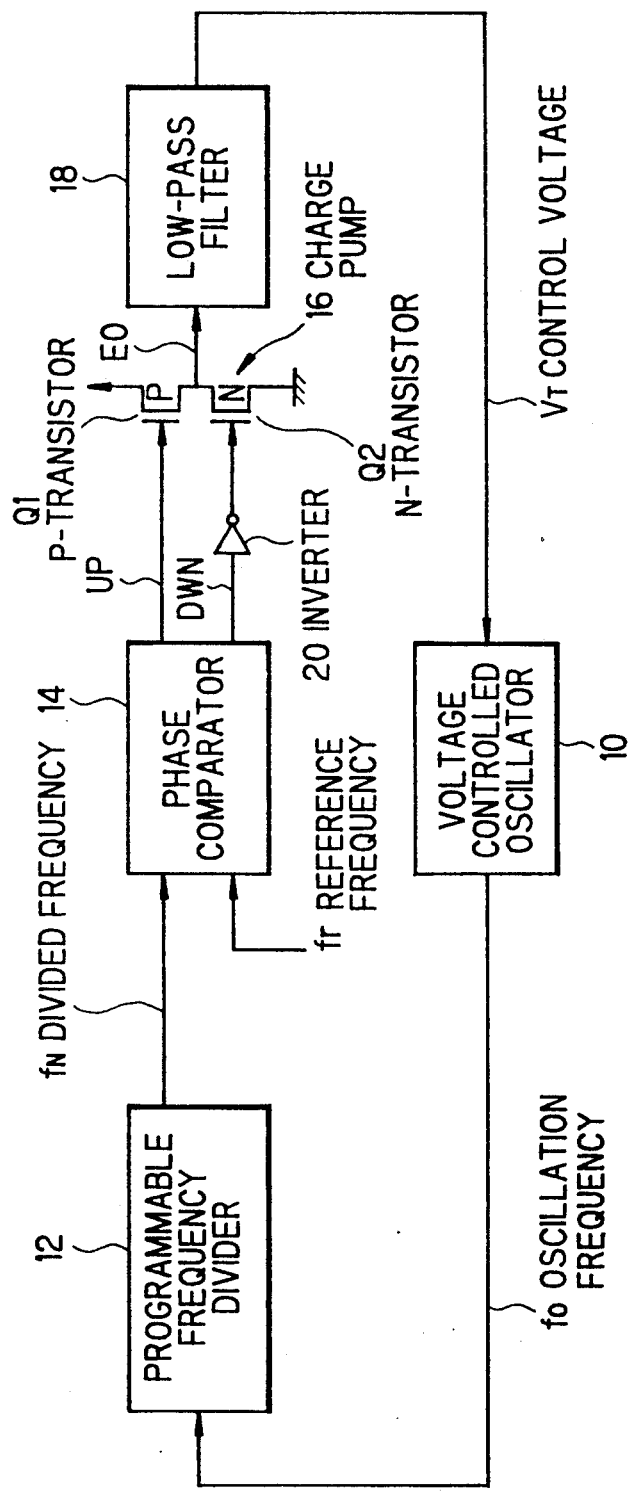
FIG. 1 is a block diagram showing a first conventional phase-locked loop circuit.

FIG. 1 shows a first conventional phase-locked loop circuit. The phase-locked loop circuit comprises a voltage controlled oscillator 10, a programmable frequency divider 12, a phase comparator 14, a charge pump 16 comprising a P-channel transistor Q1 and an N-channel transistor Q2, and a low-pass filter 18.

The voltage controlled oscillator 10 generates a oscillation signal having a frequency of $f_o$, and supplies the oscillation frequency $f_o$ to the programmable frequency divider 12.

The programmable frequency divider 12 divides the oscillation frequency $f_o$ by a predetermined frequency dividing ratio N, and supplies a divided frequency $f_N$ to the phase comparator 14.

The phase comparator 14, generally of a type of a comparator as described in the U.S. Pat. No. 3,610,954, compares the divided frequency $f_N$ with a reference frequency $f_r$, and supplies a up-request signal UP or a down-request signal DWN to the charge pump 16 in accordance with a result of the comparison. The signals UP and DWN supplied from the phase comparator 14 are high at a lock-state where a divided frequency $f_N$ is equal to a reference frequency $f_r$. These high level signals are defined "lock-up signals". The up-request signal UP of low level is supplied from the phase comparator 14 to the transistor Q1 of the charge pump 16 directly when the divided frequency $f_N$ is lower than the reference frequency $f_r$. On the other hand, the down-request signal DWN of low level is supplied from the phase comparator 14, when the divided frequency $f_N$ is higher than the reference frequency $f_r$, and the signal DWN is supplied to the transistor Q2 of the charge pump 16 after being inverted into a high level by an inverter 20. The up-request signal UP and the down-request signal DWN are intermittently supplied to the charge pump 16 in accordance with a phase difference between the divided frequency $f_N$ and the reference frequency $f_r$.

The charge pump 16 supplies a signal EO to the low-pass filter 18 in response to the signals from the phase comparator 14 to control charge and discharge of the low-pass filter 18.

The low-pass filter 18 supplies a control voltage signal $V_T$ based on the signal EO to the voltage controlled oscillator 10 to control the oscillation frequency $f_o$.

In operation, when the lock-up signals are supplied from the phase comparator 14 to both of the transistors Q1 and Q2, the transistors Q1 and Q2 are high impedance states, so that the control voltage signal $V_T$ is not changed. Thus, the oscillation frequency $f_o$ supplied from the voltage controlled oscillator 10 is fixed at a predetermined frequency.

Figure 2A:
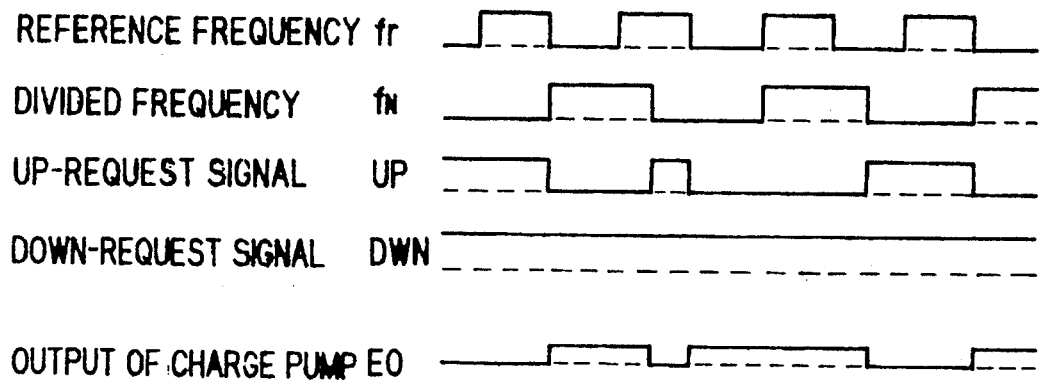
FIGS. 2A and 2B are timing charts showing operation in the conventional phase-locked loop circuit shown in FIG. 1.
Figure 2B:
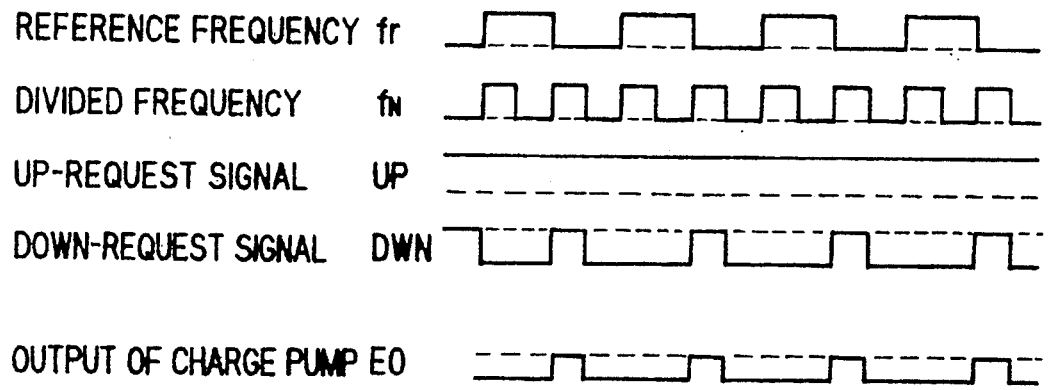

When the divided frequency $f_N$ is less than the reference frequency $f_r$, as shown in FIG. 2A, the up-request signal UP of low level is supplied intermittently from the phase comparator 14 to the transistor Q1 of the charge pump 16 as a result of a phase comparison therebetween, so that the transistor Q1 is turned on, the output signal EO of high level $V_{CC}$ is intermittently supplied from the charge pump 16 to the low-pass filter 18. While the transistor Q2 is turned off by the down-request signal DWN of high level which is inverted by the inverter 20. On the other hand, when the divided frequency $f_N$ is greater than the reference frequency $f_r$, as shown in FIG. 2B, the down-request signal DWN of low level is supplied intermittently from the phase comparator 14 to the transistor Q2 of the charge pump 16, so that the transistor Q2 is turned on, while the transistor Q1 is turned off, the output signal EO of ground level is intermittently supplied from the charge pump 16 to the low-pass filter 18.

When the signal EO of the high or ground level is intermittently supplied from the charge pump 16 to the low-pass filter 18, the control voltage $V_T$ is increased or decreased based on the charge or discharge therein to be supplied from the low-pass filter 18 to the voltage controlled oscillator 10, so that the oscillation frequency $f_o$ of the voltage controlled oscillator 10 is controlled by the control voltage signal $V_T$, until the divided frequency $f_N$ becomes equal to the reference frequency $f_r$.

In the first conventional phase-locked loop circuit, the signal EO from the charge pump 16 is intermittently supplied to the low-pass filter 18, so that the control voltage $V_T$ is not increased or decreased to be a lock-up voltage at an expected speed. Therefore, it takes a long time to provide a lock-state.

FIG. 3 shows a part of a second conventional phase-locked loop circuit. The phase-locked loop circuit comprises a lock up detecting circuit 22, a charge pump 24 consisting of a P-channel transistor Q5 and an N-channel transistor Q6, and a control switch 26 connected between the low-pass filter 18 and the charge pump 24, in addition to the circuit structure of the first conventional phase-locked loop circuit shown in FIG. 1.

In the second conventional phase-locked loop circuit, the lock-up state is detected in accordance with the signals supplied from the phase comparator 14 by the lock-up detecting circuit 22. When a nonlock-up state is detected by the lock-up detecting circuit 22, the switch 26 is closed in response to a signal from the lock-up detecting circuit 22, so that a signal E00 from the charge pump 24 which is supplied via the switch 26 is added to the signal supplied from the change pump 16 to provide a combined signal E0 to the low-pass filter 18, thereby to increase charge and discharge capability. On the other hand, when the lock-up state is detected by the lock-up detecting circuit 22, the switch 26 is opened, so that no signal is supplied from the charge pump 24 to the low-pass filter 18. Thus, the lock-up state is not affected by noise, even if the charge pump 24 malfunctions by the noise.

According to the second conventional phase-locked loop circuit, a control voltage $V_T$ supplied from the low-pass filter 18 increases at a speed twice that of the first conventional circuit, because the charge pump 24 is activated in response to the signal from the lock-up detecting circuit 22. Therefore, a lock-up time is shortened by a half that of the first conventional circuit. However, even in the second conventional circuit, the shortening of the lock-up time is not sufficient for a recently proposed radio tuner.

Figure 4:
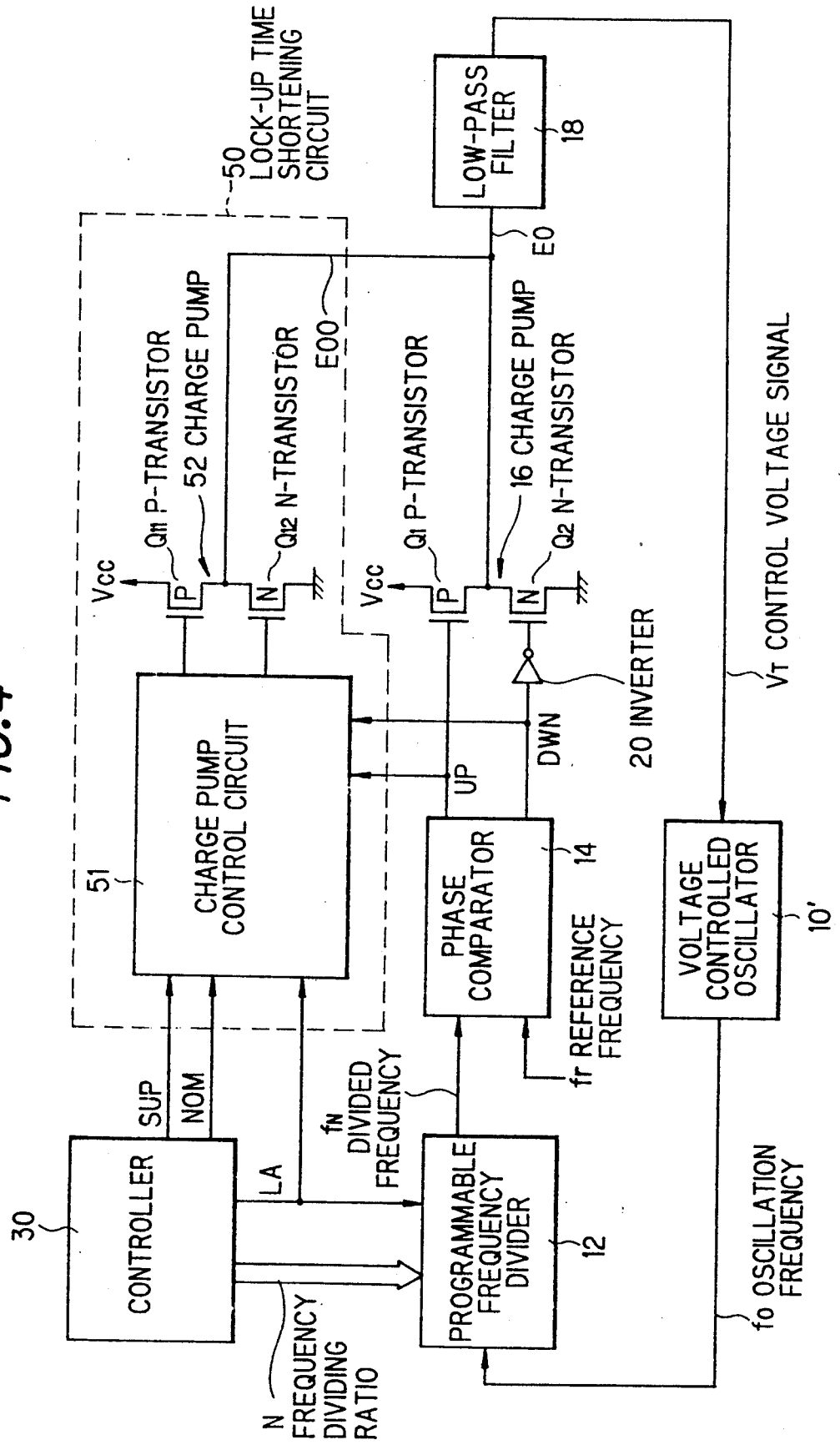
FIG. 4 is a block diagram showing a phase-locked loop circuit of a first preferred embodiment according to the invention.

Next, FIG. 4 shows a phase-locked loop circuit of a first preferred embodiment according to the invention. The phase-locked loop circuit comprises a controller 30, and a lock-up time shortening circuit 50 in addition to the first conventional phase-locked loop circuit shown in FIG. 1.

The controller 30, such as a microcomputer, controls the programmable frequency divider 12 and the lock-up time shortening circuit 50. In more detail, the controller 30 supplies a frequency dividing ratio N, and a latch signal LA instructing of writing the frequency dividing ratio N to the programmable frequency divider 12. In addition, the controller 30 supplies a signal SUP to activate the lock-up time shortening circuit 50, and a signal NOM to inactivate the lock-up time shortening circuit 50 thereto along with the latch signal LA.

The lock-up time shortening circuit 50 supplies a signal EOO to the low-pass filter 18 in response to signals from the controller 30 and the phase comparator 14, so that a lock-up time is sufficiently shortened, as described later.

Figure 5:
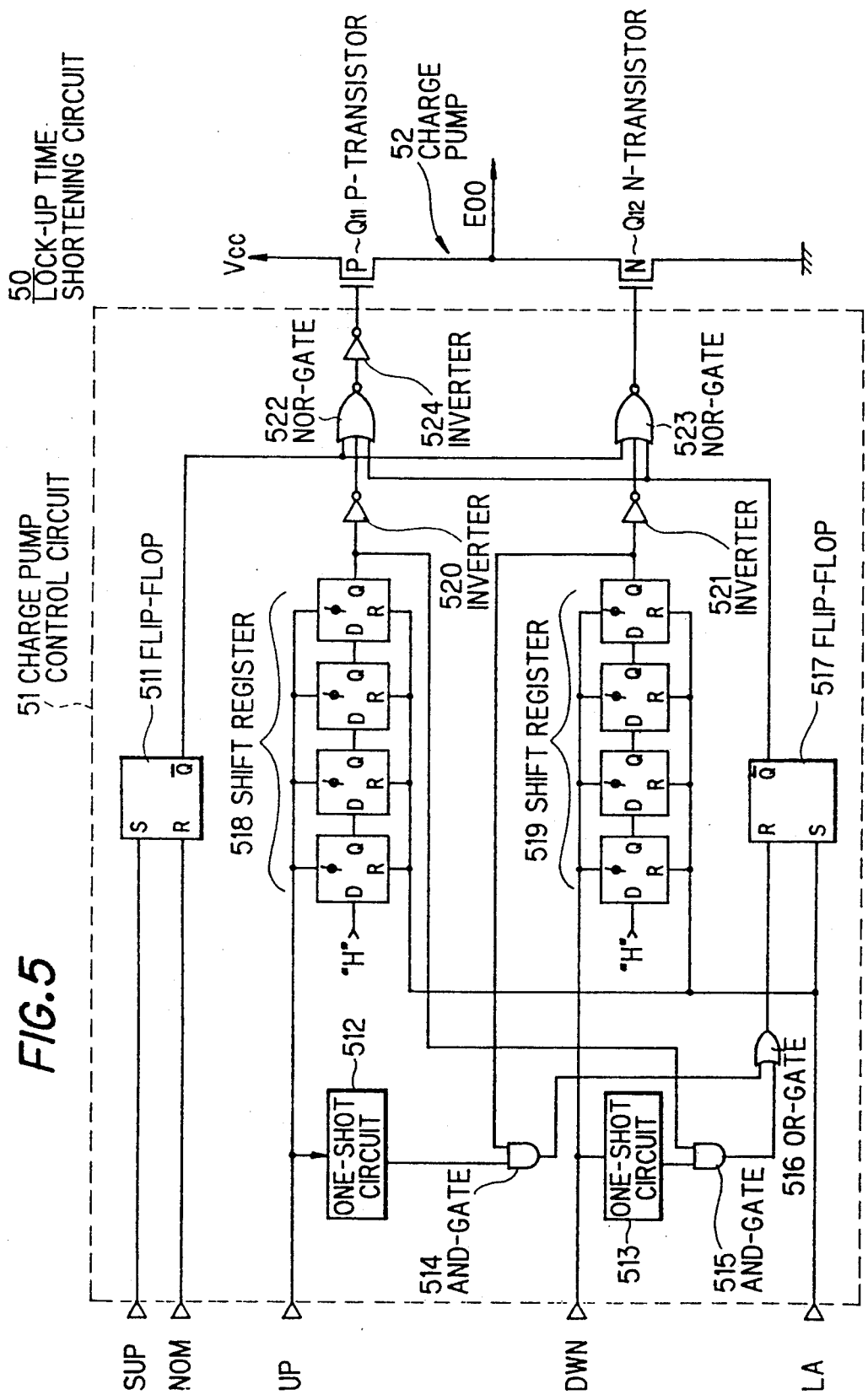
FIG. 5 is a circuit diagram showing a lock-up time shortening circuit in the first preferred embodiment shown in FIG. 4.

FIG. 5 shows a detailed structure of the lock-up time shortening circuit 50 which comprises a charge pump control circuit 51, and a charge pump 52 controlled by the charge pump control circuit 51.

The charge pump control circuit 51 comprises a flip-flop 511 which is responsive to the signals SUP and NOM from the controller 30, one-shot circuits 512 and 513 which are responsive to the signals UP and DWN from the phase comparator 14 respectively, AND gates 514 and 515, an OR gate 516, a flip-flop 517, shift registers 518 and 519 which are responsive to the signals UP and DWN from the phase comparator 14 to shift high level signals "Hs", respectively, inverter 520 and 521 inverting the shifted signals "Hs" from the shift registers 518 and 519 respectively, NOR gates 522 and 523, and an inverter 524 inverting a signal from the NOR gate 522.

The charge pump 52 comprises a P-channel transistor Q11 and an N-channel transistor Q12, and the output signal EOO of the charge pump 52 is supplied to the low-pass filter 18 after being combined with the signal supplied from the charge pump 16.

The shift registers 518 and 519 consist of four flip-flops respectively so that a malfunction of the charge pump 52 by noise is certainly avoided. That is, the shift registers 518 and 519 do not supply a high level output signal, even if less than three noise pulses are supplied into the shift register 518 or 519.

Figure 6:
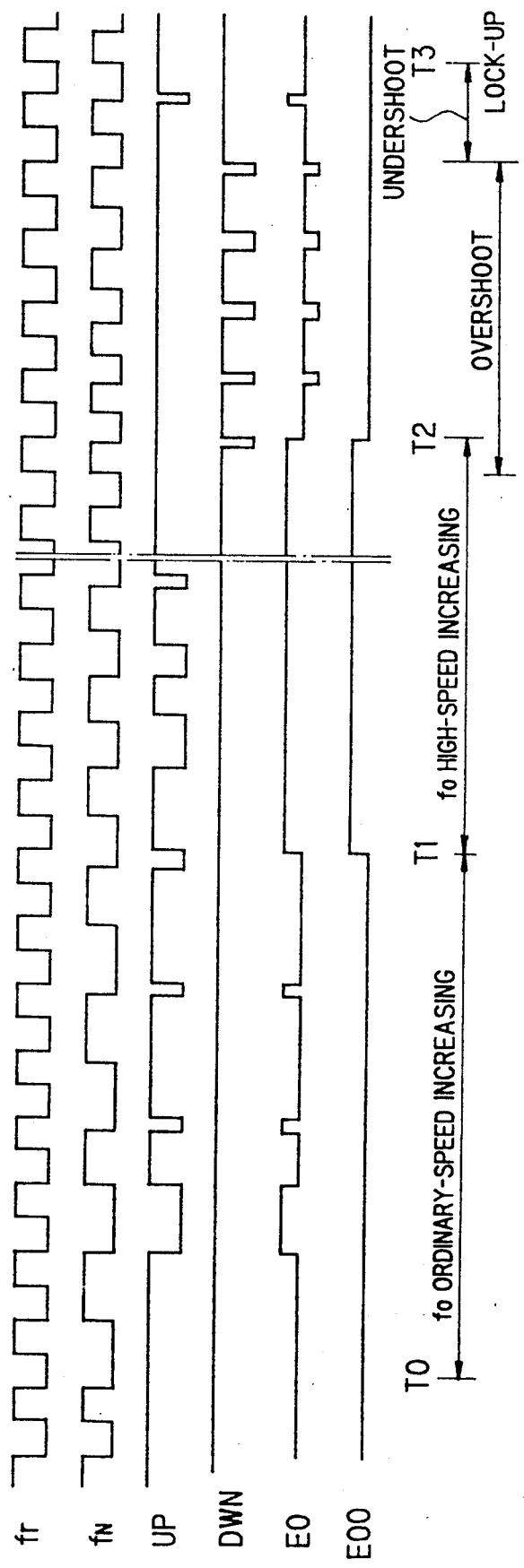
FIG. 6 is a timing chart showing operation in the first preferred embodiment shown in FIG. 4.
Figure 7:
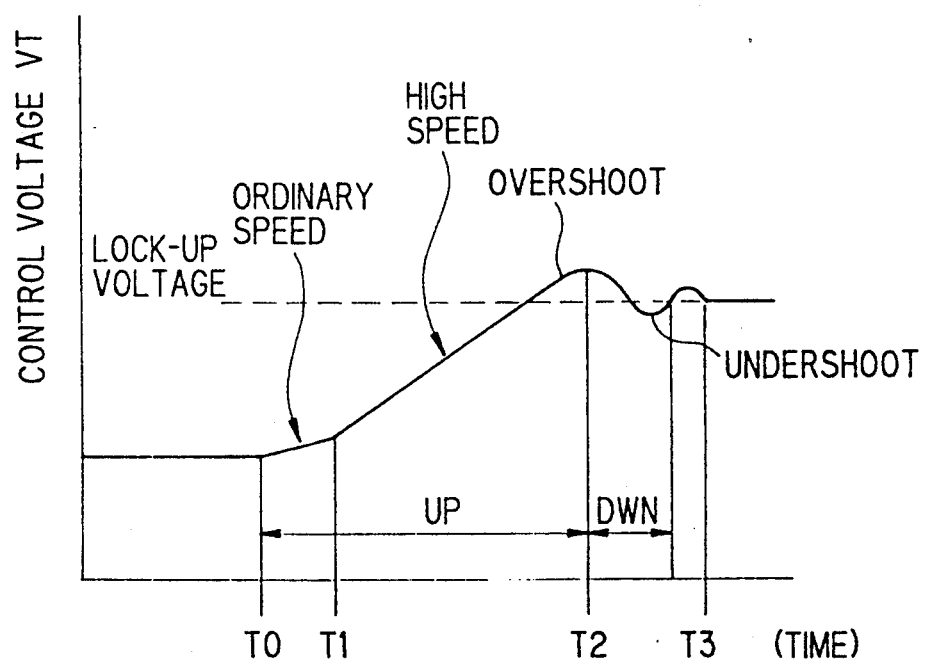
FIG. 7 is a graph showing a change of a control voltage applied to a voltage controlled oscillator in the first preferred embodiment shown in FIG. 4.

FIG. 6 shows a timing chart showing operation of the first preferred embodiment, especially, a relation among a level of the signals UP, DWN, EO, and EOO, and a reference frequency $f_r$ and a divided frequency $f_N$. FIG. 7 shows the change of the control voltage $V_T$ relative to time.

In operation, when the signal NOM is supplied from the controller 30 to the lock-up time shortening circuit 50, the lock-up time shortening circuit 50 becomes inactivate. That is, a high level signal is supplied from an inverted terminal $\overline{Q}$ of the flip-flop 511 to the NOR gates 522 and 523, so that a high level signal is supplied to the P-channel transistor Q11 via the inverter 524 and a low level signal is supplied to the N-channel transistor Q12 directly. Therefore, the transistors Q11 and Q12 are under high impedance state. As the result, the phase-locked loop circuit is in the same condition as the first conventional circuit shown in FIG. 1.

On the other hand, the lock-up time shortening circuit 50 becomes activate, when the signal SUP is supplied from the controller 30 to the lock-up time shortening circuit 50, because a receiving frequency is changed, for instance, by selecting another broadcasting station at a radio receiver. Therefore, a frequency dividing ratio N is changed to correspond to an oscillation frequency to be changed by the controller 30, and is supplied to the programmable frequency divider 12. At the same time, the latch signal LA is supplied from the controller 30 to the programmable frequency divider 12 and the charge pump control circuit 51. In response to the latch signal LA, the shift registers 518 and 519 are reset to provide an initial state, and the flip-flop 517 is set to provide a low level output signal.

Before the change of the frequency dividing ratio N, if the phase-locked loop circuit is in a lock-state, the up-request signal UP and the down-request signal DWN are not charged to be a high level, so that a low level signal is supplied to the NOR gates 522 and 523. Therefore, the transistors Q11 and Q12 are held under a high impedance state.

When the divided frequency $f_N$ is lower than a reference frequency $f_r$ by selecting a broadcasting station having a frequency higher than a frequency of the former broadcasting station, as typically shown in FIG. 6 by a time of T0 to T1, the up-request signal UP of a low level is supplied from the phase comparator 14 to the charge pump control circuit 51 in addition to the charge pump 16 (T0). Therefore, the low-pass filter 18 is intermittently driven by only the signal from the charge pump 16, and a high level signal "H" is supplied from the shift register 518 to the inverter 520 (T1), after four pulses of the up-request signal UP have been supplied thereto, because the up-request signal UP is used as a clock signal.

Then the high level signal is inverted three times, by the inverter 520, the NOR gate 522, and the inverter 524, so that the transistor Q11 becomes ON state which is held by subsequent up-request signal UP, so that a high level signal $V_{CC}$ is continually applied from the charge pump 52 to the low-pass filter 18 as an output signal E00. Consequently, the control voltage signal $V_T$ is continually supplied to the voltage controlled oscillator 10 by the low-pass filter 18 (T1 to T2). Therefore, an oscillation frequency $f_o$ is increased at a high speed from the time T1 to a time T2.

When the divided frequency $f_N$ becomes higher than the reference frequency $f_r$ as seen in FIG. 6 by "overshoot", the down-request signal DWN is generated in the phase comparator 14, so that a one-shot pulse is supplied to one of terminals of the AND gate 515 by the one-shot circuit 513 in response to the signal DWN, while a high level signal is supplied from the shift register 518 to the other terminal of the AND gate 515. Therefore, a high level signal is supplied from AND gate 515 to a reset terminal of the flip-flop 517 through the OR gate 516. The flip-flop 517 is reset in response to a signal from the AND gate 515, so that low level signals are supplied from the NOR gates 522 and 523, respectively, in response to a high level signal from the flip-flop 517. Therefore, the lock-up time shortening circuit 50 becomes inactivate, and the low-pass filter 18 is driven dependent only on the charge pump 16. That is, after the lock-up time shortening circuit 50 in turned into the inactivation state, the signal EO of ground level is intermittently supplied to the low-pass filter 18 by the charge pump 16 during the overshoot state period, so that the oscillation frequency $f_o$ is decreased at an ordinary speed to a lock-up frequency. After the experience of the overshoot and undershoot periods as shown in FIG. 6, the phase-locked loop circuit provides the lock-up state at a time T3.

In the phase-locked loop circuit according to the first preferred embodiment, an output signal of the shift register 518 is maintained to be high level until the down-request signal DWN is supplied by the phase comparator 14, so that an overshoot is occurred for a short period as described above. However the overshoot is considerably small, because the signal EOO is quickly discontinued in response to the signal DWN. Therefore, the lock-up time is practically shortened at each time when a frequency dividing ratio N is changed.

In FIG. 7, the control voltage $V_T$ is maintained to be constant voltage during a period prior to T0, and is increased at an ordinary speed realized by the charge pump 16 during a period of T0 to T1. Then, the increasing speed of the control voltage $V_T$ is controlled to be large by the continuous application of the voltage $V_{CC}$ to the low-pass filter 18 during a period of T1 to T2. As soon as the overshoot is detected, the decrease of the control voltage $V_T$ is conducted not so as to start the continuous application of ground level by setting the number of the flip-flops for the shift register 519 to be an appropriate value. Consequently, the control voltage $V_T$ is locked up to be a lock-up voltage at the time T3 only by experiencing a small overshoot arising after the undershoot.

On the other hand, when a divided frequency $f_N$ is higher than a reference frequency $f_r$, a proceeding to the lock-up state is accomplished in the same manner as described above, because the lock-up shortening circuit 50 is constructed symmetrically as shown in FIG. 5. Therefore, an explanation of operation, in which an oscillation frequency 50 is decreased, is omitted.

In the first preferred embodiment, each of the shift registers 518 and 519 may comprises only one stage of a flip-flop in place of the four stages of flip-flops, so that the shift register 518 provides a high-level output by the generation of only one up-request signal.

Figure 8:
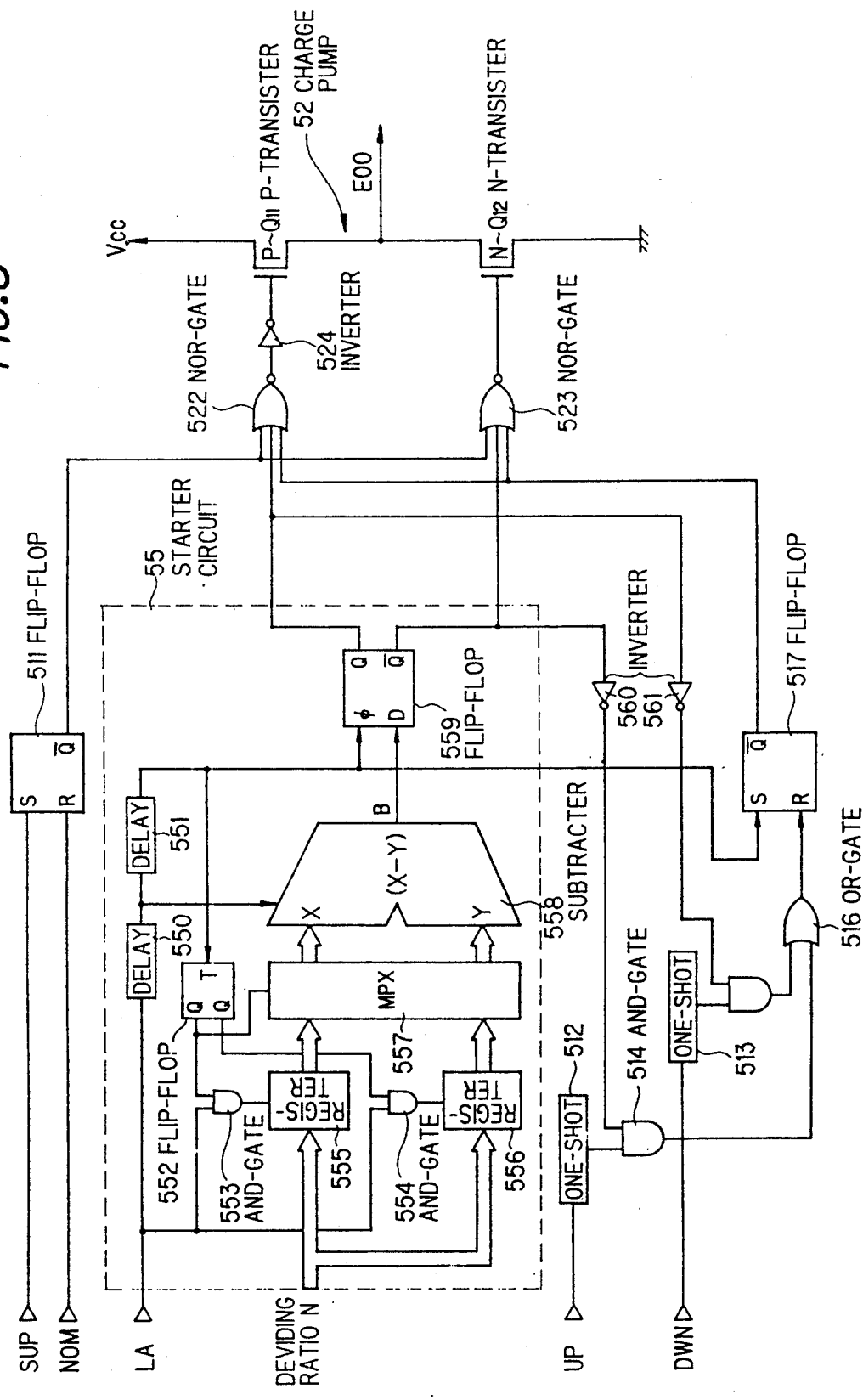
FIG. 8 is a circuit diagram showing a lock-up time shortening circuit in a second preferred embodiment according to the invention.

FIG. 8 shows a lock-up time shortening circuit of a second preferred embodiment according to the invention. The lock-up time shortening circuit comprises a starter circuit 55 corresponding to the shift registers 518 and 519 of the first preferred embodiment shown in FIG. 5. The starter circuit 55 controls a starting of the charge pump 52 in accordance with a result of a calculating in response to the frequency dividing ratio N. The starter circuit 55 comprises two delay circuits 550 and 551, a T-type flip-flop 552, two AND gates 553 and 554, two registers 555 and 556, a multiplexer 557, a subtracter 558, and a flip-flop 559 connected with two inverters 560 and 561 at output terminals thereof.

One of the registers 555 and 556 is supplied with a frequency dividing ratio $N_n$, and the other register is supplied with a subsequent frequency dividing ratio $N_{n+1}$. The registers 555 and 556 store the frequency dividing ratios $N_n$ and $N_{n+1}$ alternately in response to the latch signal LA supplied via the flip-flop 552 and two AND gates 553 and 554. The registers 555 and 556 supply the frequency dividing ratio $N_n$ and $N_{n+1}$ to the multiplexer 557, which supplies the frequency dividing ratio $N_n$ and $N_{n+1}$ to the subtractor 558 in response to a signal from an output terminal Q of the flip-flop 552. In more detail, when a high level signal is supplied from the output terminal Q of the flip-flop 552, a frequency dividing ratio stored in the register 555 is supplied to an input terminal X of the substracter 558, and a frequency dividing ratio stored in the register 556 is supplied to an input terminal Y thereof. On the other hand, when a low level signal is supplied from the output terminal Q of the flip-flop 552, a frequency dividing ratio stored in the register 555 is supplied to the input terminal Y, and a frequency dividing ratio stored in the register 556 is supplied to the input terminal X.

The substracter 558 substracts an input data of the terminal Y from an input data of the terminal X in response to the latch signal LA supplied through the delay circuit 550, and carries a borrow output B in accordance with a result of the calculation.

The flip-flop 559 stores the borrow output B in response to the latch signal LA supplied through the delay circuits 550 and 551. The flip-flop 559 supplies output signals from the output terminals Q and $\overline{Q}$ to the NOR gates 552 and 523 respectively.

In operation, when the present frequency dividing ratio N is changed, the subsequent frequency dividing ratio $N_{n+1}$ is supplied to the starter circuit 55 along with the latch signal LA. The frequency dividing ratio $N_{n+1}$ is stored in the register 555, when the precedent frequency dividing ratio $N_n$ is stored in the register 556. The frequency dividing ratios $N_{n+1}$ and $N_n$ are then supplied from the registers 555 and 556 to the input terminals X and Y of the subtracter 558 via the multiplexer 557 respectively, and the calculation is carried out in the substracter 558 in response to the latch signal LA.

Next, when the frequency dividing ratio $N_{n+1}$ (X) is larger than the precedent frequency dividing ratio $N_n$ (Y), the borrow output B is carried, so that a low level signal is supplied from the output terminal Q and a high level signal is supplied from an output terminal $\overline{Q}$ of the flip-flop 559. Thus, the transistor Q11 becomes ON state, and the transistor Q12 becomes OFF state. After that, the low-pass filter 18 is controlled to provide a control voltage $V_T$ for increasing an oscillation frequency $f_o$ of the voltage controlled oscillator 10 in the same manner as that in the first preferred embodiment shown in FIGS. 4 and 5.

Next, the transistors Q11 and Q12 become a high impedance state when the down-request signal DWN is supplied from the phase comparator 14. The standing frequency dividing ratio stored in the register 555 is transferred to the register 556, then the stater circuit 55 waits a next instruction to operate in the same manner as described above. The circuit elements having the same reference numerals in FIG. 8 as those in FIG. 5 operate in the same manner.

According to the second preferred embodiment, a malfunction of the charge pump 52 by noise, for instance, carried on an output signal supplied from the phase comparator 14, is certainly avoided, because the charge pump 52 is controlled by the starter circuit 55 in accordance with a frequency difference between a present frequency dividing ratio $N_n$ and a subsequent frequency dividing ratio $N_{n+1}$.

Figure 9:
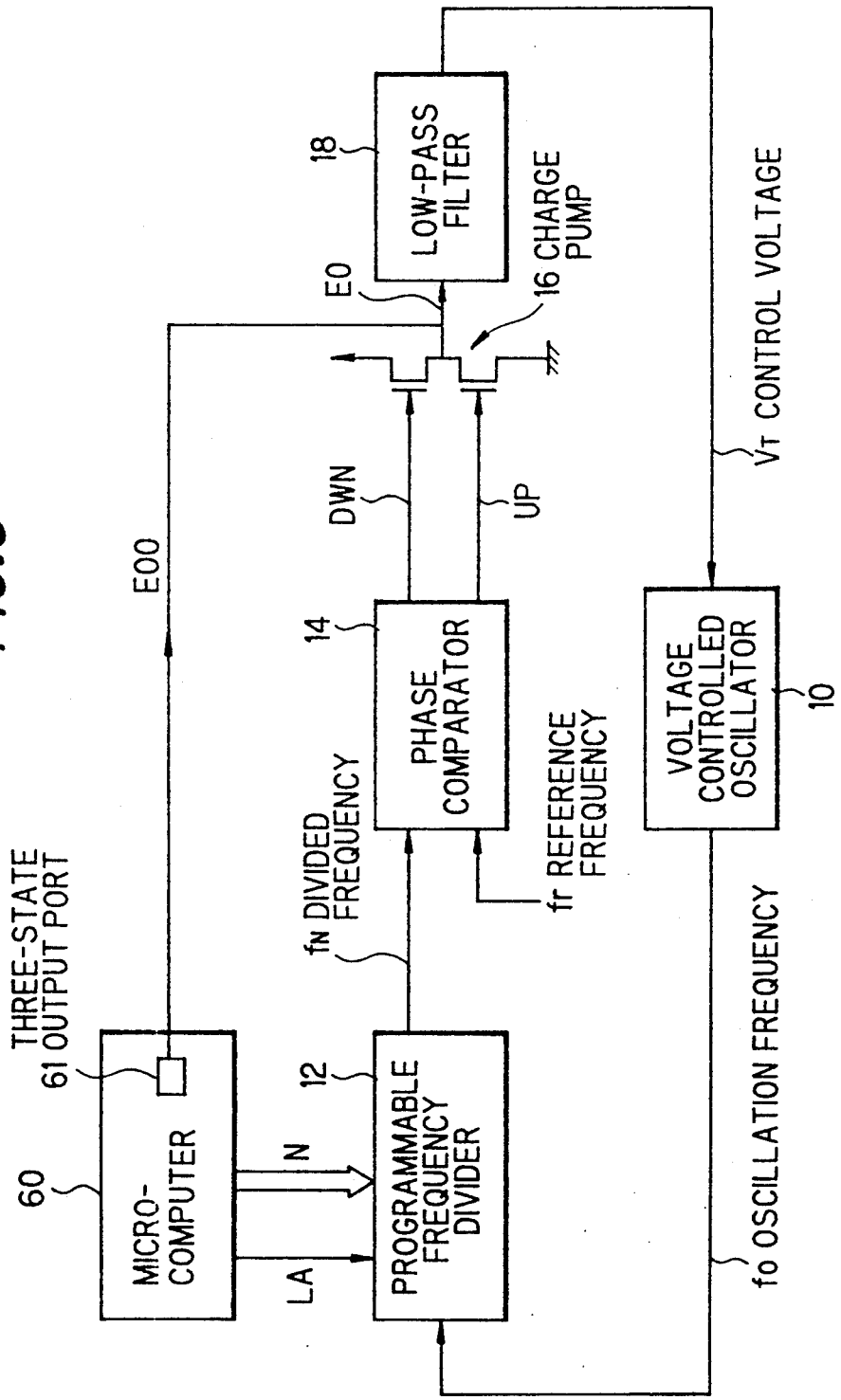
FIG. 9 is a block diagram showing a phase-locked loop circuit of a third preferred embodiment according to the invention.

FIG. 9 shows a phase-locked loop circuit of a third preferred embodiment according to the invention. The phase-locked loop circuit comprises a microcomputer 60 having a three state output port 61 in addition to the conventional phase-locked loop circuit shown in FIG. 1.

In this embodiment, the low-pass filter 18 is controlled by the microcomputer 60 without depending on a signal from the phase comparator 14 like the first and second preferred embodiments shown in FIGS. 4, 5 and 8. That is, the microcomputer 60 controls the low-pass filter 18 in dependence on a lock-up time which is calculated from a time constant of the low-pass filter 18 and a changing amount of frequency dividing ratios. If the time constant of the low-pass filter 18 is fixed, the lock-up time is calculated proportionally to a difference between a present frequency dividing ratio $N_n$ and a subsequent frequency dividing ration $N_{n+1}$.

Figure 10:
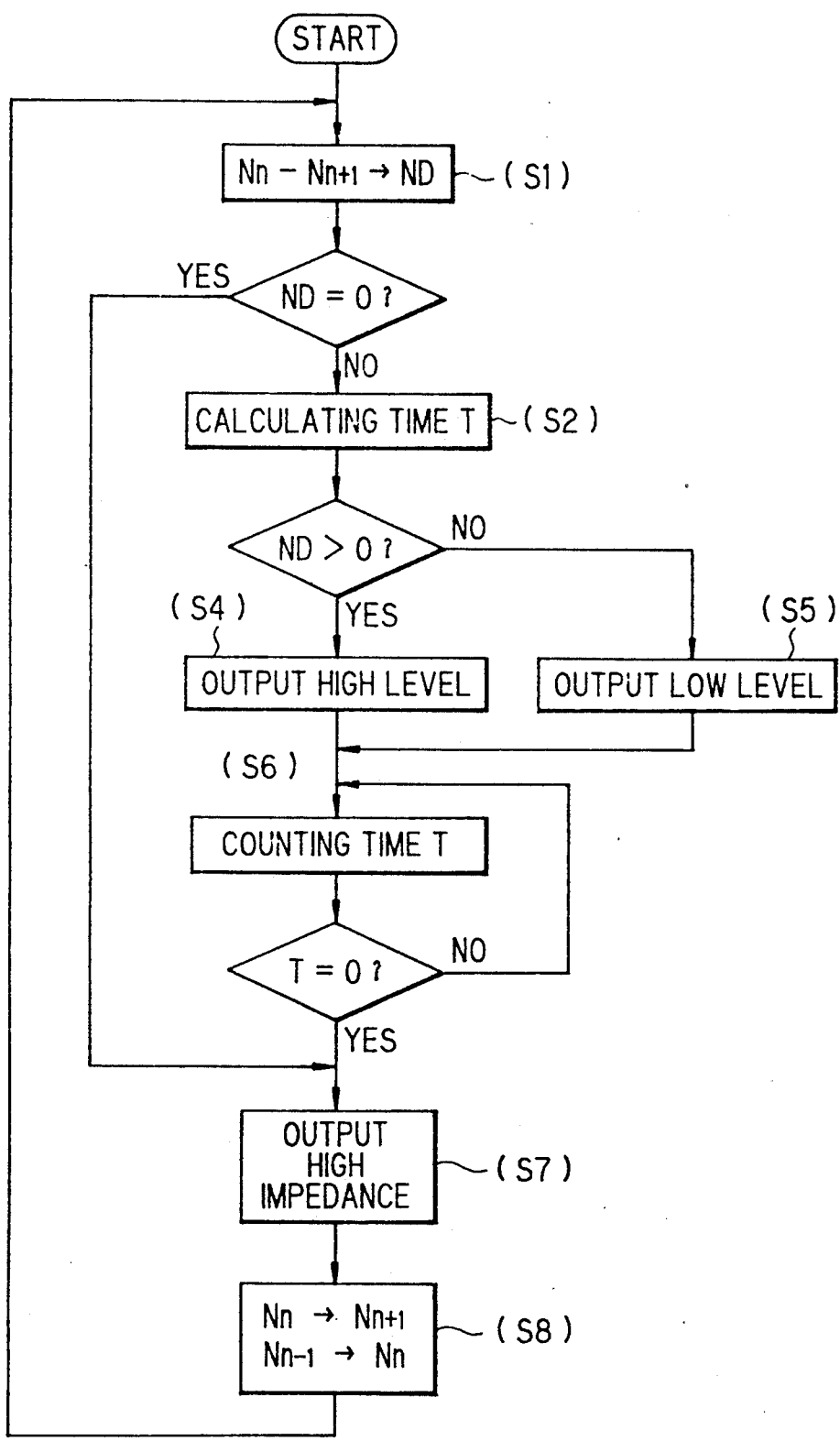
FIG. 10 is a flow chart showing operation of a microcomputer in the third preferred embodiment shown in FIG. 9.

FIG. 10 is a flow chart explaining operation of the microcomputer 60. In this preferred embodiment, when a present frequency dividing ratio $N_n$ is changed, calculating a frequency dividing ratio difference ND between the present ratio $N_n$ and the subsequent ratio $N_{n+1}$ is carried out (S1), while the subsequent frequency dividing ratio $N_{n+1}$ is written in the programmable frequency divider 12 by the microcomputer 60. As a result of the calculation, if the difference is zero, that is, the present frequency dividing ratio $N_n$ is equal to the subsequent frequency dividing ratio $N_{n+1}$, it is concluded that the phase-locked loop circuit is in a lock-up state, so that the output port 61 is controlled to be high impedance state.

On the other hand, if the frequency dividing ratio difference ND is not zero, calculating a lock-up time T is carried out (S2). This calculation may be omitted, if the time T is stored in a table in advance. If the frequency dividing ratio difference ND is a positive quantity, supplying a signal EOO of high level to the low-pass filter 18 (S4). If the difference of frequency dividing ratio ND is a negative quantity, supplying a signal EOO of a low level to the low-pass filter 18 is carried (S5).

A time of supplying the positive or negative signal EOO is proportional to the frequency dividing ratio difference ND, as described above. That is, the signal E00 is supplied during the time T calculated previously and stored in the micro-computer 60. The output port 61 becomes a high impedance state (S7) after the time T is counted in the microcomputer 60 (S6). After that, the same steps are repeated (S8), when a receiving frequency is changed.

As explained above, according to the first to third preferred embodiments, the low-pass filter 18 is charged and discharged continually during a controlled period, so that the lock-up time is shortened sufficiently.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. A phase-locked loop circuit, comprising:
    a voltage controlled oscillator which generates a signal having a frequency depending on an applied voltage;
    a frequency divider which divides said frequency of said signal supplied from said voltage controlled oscillator;
    a phase comparator which compares said frequency divided by said frequency divider with a reference frequency;
    means for applying a control voltage to said voltage controlled oscillator so that said frequency divided by said frequency divider is equal to said reference frequency; and
    means for controlling said applying means in response to a signal supplied from said phase comparator to generate said control voltage, wherein said control voltage is changed in said applying means in a direction selected from increasing and decreasing directions by at least two different changing rates, when a phase difference is detected in said phase comparator, and a larger changing rate is selected from said at least two different changing rates, when a lock-up time for equalizing said divided frequency to said reference frequency is controlled to be shortened, and wherein said controlling means includes:
        a first charge pump which supplies an intermittent control signal to said applying means in response to a signal supplied from said phase comparator to drive said applying means intermittently, said control voltage having a smaller changing rate selected from said at least two different changing rates being generated in said applying means by said intermittent control signal,
        a second charge pump which supplies a continuous control signal to said applying means, said control voltage having said larger changing rate being generated in said applying means by said continuous control signal, and
        a control circuit for exclusively controlling said second charge pump to generate said intermittent control signal and said continuous control signal, so that said control voltage having said at least two changing rates is generated in said applying means.

2. A phase-locked loop circuit, according to claim 1, wherein:
    said control circuit, includes:
    means for counting a number of signals indicating said phase difference; and
    means for holding said second charge pump in an inactivate state, before said number of signals is less than a predetermined value, and for setting said second charge pump is a continuous active state, after said number of signals is more than said predetermined value, and before a direction of said phase difference is inverted.

3. A phase-locked loop circuit, according to claim 1, wherein:
    said control circuit, includes:
    a timer for counting a predetermined time;
    means for detecting a difference of frequency dividing ratios in said frequency divider; and
    means for holding said second charge pump in an inactive state, before said predetermined time is elapsed, when said frequency dividing ratio difference is detected, and for setting said second charge pump in a continuous active state, after said predetermined time is elapsed, and before a direction of said phase difference is inverted.

4. A phase-locked loop circuit, according to claim 1, wherein:
    said control circuit is a micro-computer having a stored program, by which said second charge pump is controlled to operate continually for a time period dependent on a difference of frequency dividing ratios in said frequency divider.

5. A phase-locked loop circuit, comprising:
    means for generating a control voltage signal to be supplied to a voltage controlled oscillator, said voltage controlled oscillator generating an oscillation signal of a frequency dependent on a voltage of said control voltage signal;
    a comparator for generating an up-request signal and a down-request signal in accordance with a comparison between a reference frequency and a frequency obtained by division of said frequency of said oscillation signal;
    a first charge pump for charge and discharge of said generating means, said first charge pump being driven intermittently by one of said up-request signal and said down-request signal supplied from said comparator; and
    a second charge pump for charge and discharge of said generating means in parallel with said first charge pump, said second charge pump being driven continually for a limited period during an intermittent driving of said first charge pump.

* * * * *